United States Patent [19]

Higashibata et al.

[11] Patent Number: 4,959,348

[45] Date of Patent: Sep. 25, 1990

[54] Y-BA-CU-O SUPERCONDUCTOR FOR CONTAINING ANTIMONY OR BORON TO INCREASE CURRENT DENSITY

[75] Inventors: Kouji Higashibata; Hironori Suzuki, both of Yokohama, Japan

[73] Assignee: Kabushiki Kaisha Toshiba, Kawasaki, Japan

[21] Appl. No.: 269,065

[22] Filed: Nov. 9, 1988

[30] Foreign Application Priority Data

Nov. 9, 1987 [JP] Japan ................................ 62-281004
Dec. 16, 1987 [JP] Japan ................................ 62-316160

[51] Int. Cl.$^5$ ..................... C01F 17/00; C01F 11/02; C01G 3/02; H01L 39/12
[52] U.S. Cl. ......................................... 505/1; 75/234; 419/22; 423/604; 423/635; 501/123; 502/346; 505/775
[58] Field of Search ..................... 505/1, 775; 423/604, 423/635; 502/346; 501/123

[56] References Cited

U.S. PATENT DOCUMENTS 4,540,677 9/1985 Enomoto et al. ................... 501/88

OTHER PUBLICATIONS

Kobayashi, "Single Crystal ESR Study of $Y_2BaCuO_5$" *Jap. Jnl. of Appld. Phys.*, vol. 27, No. 4, Apr. 1988, pp. L670–L673.
Jung, "Effect of Substitution of Bi, Ga, and Fe on the . . . " *Physical Rev. B*, vol. 37, No. 13, May 1, 1988, pp. 7510–7515.
Blower, "Bismuth Additions to Y $Ba_2Cu_3O_7$: Structural and Electrical . . . " *Solid State Comm.*, vol. 68, No. 8, Nov. 1988, pp. 765–767.
Sherwood, "Superconducting Properties of Y $Ba_2$-$Cu_3O_{7-\delta}$ Doped . . . " *Mat. Res. Soc. Symp. Proc.*, vol. 99, Nov. 30–Dec. 4, 1987, pp. 503–506.
Masuda, "Glass–Former–Doped Superconductors" *Jap. Jnl. of Appld. Phys.*, vol. 27, No. 8, Aug. 1988, pp. L1417–L1419.
Kilcoyne, "Improving Inter–Grain Contact in High–Tc Supercond." *J. Phys. D.*, vol. 20, Oct. 14, 1987, pp. 1327–1329.
Soderholm, "Incorporation of Pr in Y $Ba_2Cu_3O_{7-\delta}$: . . . " *Nature*, vol. 328, Aug. 13, 1987, pp. 604–605.
Sampathkumaran, "Absence of Solid Solution of the Type Y(Ba–RE)CuO" *Jap. Jnl. of Appld. Phys.*, vol. 27, No. 4, Apr. 1988, pp. L584–L586.
Goncalves, "Transport Properties of the Oxide $Y_{1-x}Pr_xBa_2Cu_3O_{7-x}$. . . " *Phys. Rev. B.*, vol. 37, No. 13, May 1, 1988, pp. 7476–7481.
Suzuki, "Rare–Earth(RE)–Barium Solubility Behaviour in . . . " *Jap. Jnl. of Appld. Phys.*, vol. 27, No. 5, May 1988, pp. L792–L794.
Nojiri, "Barium Copper Lead Yttrium Oxide Superconductors . . . " Jap. Patent Appli–Abstract, 10/20/88.
Yamazaki, "Manufacture of Superconductive Materials" Jap. Patent Appli–Abstract, 10/25/88.

*Primary Examiner*—Paul Lieberman
*Assistant Examiner*—John Boyd
*Attorney, Agent, or Firm*—Oblon, Spivak, McClelland, Maier & Neustadt

[57] ABSTRACT

A superconductor essentially comprises a three-component metallic oxide including yttrium, barium, and copper (Y-Ba-Cu three-component metallic oxide) and an oxide of an element having a melting point lower than that of the three-component metallic oxide and having 0.1 to 5.0 wt % in form of the oxide thereof. The element is preferably of bismuth, antimony, boron, lead, and praseodymium.

2 Claims, 1 Drawing Sheet

Y-BA-CU-O SUPERCONDUCTOR FOR CONTAINING ANTIMONY OR BORON TO INCREASE CURRENT DENSITY

BACKGROUND OF THE INVENTION

This invention relates to a superconductor particularlly usable for energy machineries or systems such as high-field magnets, current limiters, or magnetic propulsion systems.

Recently, there has been developed a superconductive material comprising a three-component metallic oxide including yttrium (Y), barium (Ba), and copper (Cu) (Y-Ba-Cu three-component metallic oxide) (for example, refer to Jpn. J. Phys. No. 26(1987)L320 and others). This three-component metallic oxide is subjected to the transposition to a superconductive material at a high temperature near or more than the liquid nitrogen temperature (77K; K: absolute temperature), thus being called a high temperature superconductor. The liquid nitrogen used as a cooling medium is cheap in price in comparison with liquid helium used conventionally, so that the fact that the critical temperature Tc thereof is of a value near or more than the liquid nitrogen temperature (77K) is very advantageous for the practical use. For example, there is known a superconductive wire material which utilizes the high temperature superconductor. The superconductive wire material which is prepared by mixing, granulating, and pre-sintering an oxide of Yttrium, barium, and copper, then crushing the thus formed oxide, filling in a sheath made of silver or the like, rolling and re-heat treating the same. The thus prepared superconductive wire material utilizing the superconductor is superior in the workability and has an excellent superconductivity, thus being suitable for a superconductor for a large and high-field magnet.

The superconductor prepared by the Y-Ba-Cu three-component metallic oxide, however, provides a problem such that the density of current passing the superconductor is small. This fact is a matter of significants in the practical use in a case where the superconductor is utilized for an energy system or machinery, and accordingly, the requirememt for the realization of a superconductor having a large current density has been increased.

SUMMARY OF THE INVENTION

An object of this invention is to substantially eliminate the defects or drawbacks of the prior art and to provide a superconductor having high current density.

This and other objects can be achieved according to this invention by providing a superconductor essentially comprising a three-component metallic oxide including yttrium, barium, and copper (Y-Ba-Cu three-component metallic oxide) and an oxide of an element having a melting point lower than that of the three-component metallic oxide of 0.1 to 5.0 wt.% in form of the oxide thereof.

In the preferred embodiment, the element is one of bismuth, antimony, boron, lead, and praseodymium.

According to the embodiment of this invention, the sintered density of the elemental material is improved by the inclusion of the oxide of the element having a melting point lower than that of the main oxide of the elemental material to thereby make dense the elemental material, thus increasing the current density therefor.

The preferred embodiment of this invention will be described further in detail hereunder with reference to the accompanying drawing.

DESCRIPTION OF THE PREFERRED EMBODIMENTS

Figure 1:
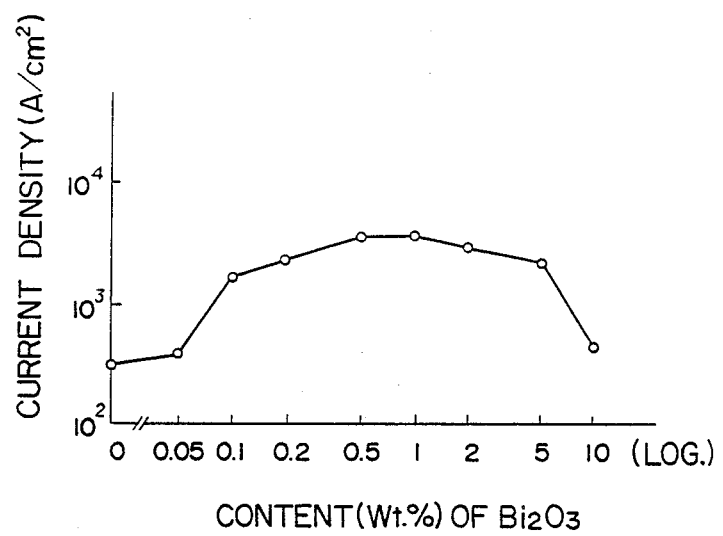
FIG. 1 is a graph representing a characteristic curve of the dependency of the current density of a superconductor with respect to the inclusion of an oxide of an element such as one of bismuth, antimony, boron, lead, and praseodymium at a temperature of 77K.

One preferred embodiment of this invention will be first described with reference to a case where bismuth is utilized.

Powders of yttrium oxide ($Y_2O_3$), barium oxide (BaO), and cupper oxide (CuO) by weights of 0.5 mol., 1.0 mol., and 3.0 mol., respectively, were prepared and mixed. Bismuth oxide ($Bi_2O_3$) was further added to the mixture by the amount of 0.05 to 10 wt.%. The thus prepared material powder mixture wa sufficiently mixed and the powder mixture was thereafter pre-sintered in the air at a temperature of about 850°C., thus preparing an Y-Ba-Cu three-component metallic oxide. The thus pre-sintered oxide powder was mixed with acetone and then crushed, and therafter, heat treated in the oxygen atmosphere to a temperature of about 850° C. to make the material superconductive. The thus prepared powder was again crushed together with acetone to obtain fine powder particles. The powder particles were filled in a sheath made of silver, then drawn by a cold rolling process, and reheat treated, thereby obtaining a superconductive wire material.

The superconductivity of the thus obtained superconductive wire material will be described hereunder with reference to FIG. 1 of the accompaning drawing. FIG. 1 shows a characteristic curve, obtained by an experiment, representing the dependency of the current density on the inclusion of the amount of the bismuth oxide ($Bi_2O_3$) at the temperature of 77K. It would be found out from the result of this experiment that the current density is in order of $10^2 A/cm^2$ in cases of no content and contents of 0.05 and 10 wt.% of the bismuth oxide, and in comparison, the current density is in order of $10^3 A/cm^2$ in case of 0.1 to 5 wt. %, thus increasing the current density. The increasing of the current density is a matter of significance for manufacturing or preparing superconductive energy machinery or apparatus such as superconductive magnets and superconductive current limiters.

According to the embodiment of this invention described above with reference to the result of the experiment, it is considered that the liquid phase sintering during the sintering process, i.e. the sintering of the material including a reactive liquid, is promoted by the addition of small amount of a material having a low melting point such as bismuth oxide to thereby obtain an element material with high sintering density, resulting in the increasing of the current density. With the addition of the bismuth oxide, in case the amount of addition is below 0.1 wt.%, no effect of promoting the liquid phase sintering, and in case the amount is over 5 wt.%, an effect of the bismuth oxide as an impurity is amplified, which adversely results in the instability of the superconductivity of the obtained superconductor.

In the foregoing description, the embodiment utylyzing the bismuth oxide is referred to, but in the experiment, it was found out that substantially the same result or effects are attained by utilizing any one of antimony, boron, lead, and praseodymium contained by the amount of 0.1 to 5 wt.% in form of bismuth oxide, antimony oxide, boron oxide, lead oxide, and praseodymium oxide, respectively, and substantially the same characteristic curve as that shown in FIG. 1 was obtained.

In the described embodiment, a described oxide material is utilized, but it will be easily understood by those skilled in the art that any material such as hydroxides, carbon oxides, and the like which constitute oxides during the sintering process may be alternatingly utilized. Moreover, the compositions of the yttrium, barium, and copper are not limited to those described hereinbefore.

What is claimed is:

1. In a superconductor formed by sintering ($Y_2O_3$), BaO), and (CuO), the improvement comprising:
   admixing prior to sintering an oxide of antimony or boron such that the superconductor resulting from said sintering contains from 0.1 to 5 wt.% antimony or boron as the oxide thereof.

2. The superconductor of claim 1, wherein said powders are admixed in a ratio of 0.5 moles ($Y_2O_3$), one mole of (BaO) and 3.0 moles of (CuO).

* * * * *